United States Patent
Ilkov

(10) Patent No.: US 10,147,657 B2
(45) Date of Patent: Dec. 4, 2018

(54) SEMICONDUCTOR DEVICES AND A METHOD OF DETECTING A CRACK

(71) Applicant: Infineon Technologies AG, Neubiberg (DE)

(72) Inventor: Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/139,171

(22) Filed: Apr. 26, 2016

(65) Prior Publication Data

US 2017/0309530 A1    Oct. 26, 2017

(51) Int. Cl.
| H01L 29/10 | (2006.01) |
| H01L 21/66 | (2006.01) |
| H01L 23/00 | (2006.01) |

(52) U.S. Cl.
CPC .......... *H01L 22/34* (2013.01); *H01L 23/562* (2013.01)

(58) Field of Classification Search
CPC .......... H01L 2924/3512; H01L 41/113; H01L 41/0825; H01L 41/1132
See application file for complete search history.

(56) References Cited

U.S. PATENT DOCUMENTS

| 6,548,881 B1 | 4/2003 | Blish et al. |
| 6,781,150 B2 | 8/2004 | Low et al. |
| 7,973,547 B2 | 7/2011 | Nitsch et al. |
| 8,803,145 B2 | 8/2014 | Patti et al. |
| 2006/0189007 A1* | 8/2006 | Aoki ....................... H01L 22/34 438/14 |
| 2007/0023915 A1 | 2/2007 | Jao et al. |
| 2009/0201043 A1* | 8/2009 | Kaltalioglu ........ G01R 31/2858 324/750.3 |
| 2012/0292759 A1 | 11/2012 | Ishikawa |
| 2014/0151702 A1 | 6/2014 | Ishikawa |
| 2015/0035556 A1 | 2/2015 | Kaltalioglu |
| 2015/0115266 A1 | 4/2015 | Sanchez et al. |

OTHER PUBLICATIONS

Search Report, in Korean language, from counterpart Korean Application No. 10-2017-0053087, dated Mar. 9, 2018, 9 pp.
Korean Office Action, in Korean, from counterpart Korean Patent Application No. 10-2017-0053087, dated May 31, 2018, 9 pp.
Office Action, in the German language, from counterpart German Application No. 102017108812.1, dated Sep. 13, 2018, 8 pp.

* cited by examiner

*Primary Examiner* — Elias M Ullah
(74) *Attorney, Agent, or Firm* — Shumaker & Sieffert, P.A.

(57) ABSTRACT

A semiconductor device including an electrical conductive sensor structure connected to a sensor circuit. At least a part of the electrical conductive sensor structure is located below a pad of the semiconductor device. Further, the sensor circuit is configured to detect a value or a change of a value of an electrical parameter associated with the electrical conductive sensor structure indicating a crack within proximity of the pad.

20 Claims, 9 Drawing Sheets

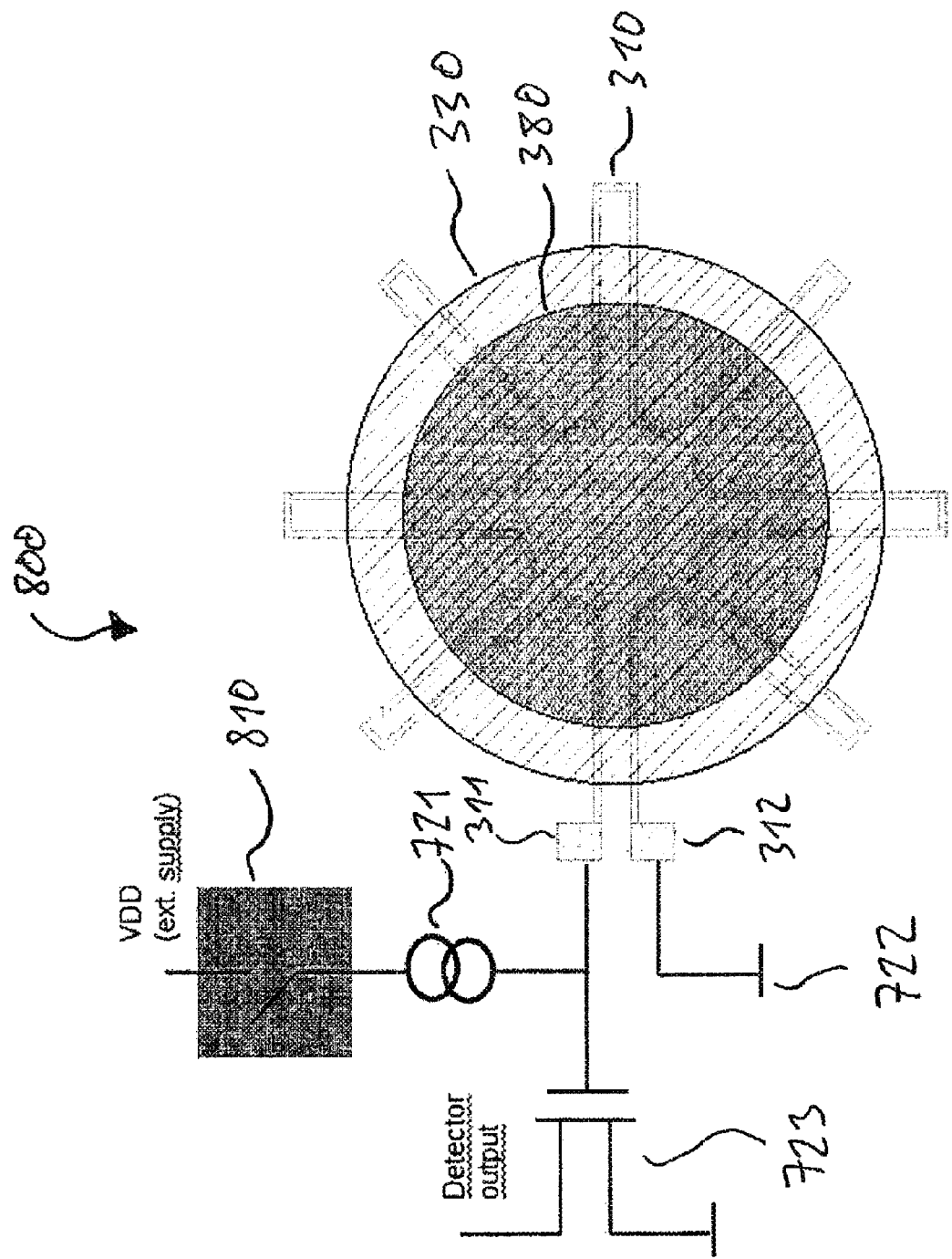

SEMICONDUCTOR DEVICES AND A METHOD OF DETECTING A CRACK

TECHNICAL FIELD

Embodiments relate to concepts for semiconductor device structures, and in particular to semiconductor devices and a method for detecting a crack.

BACKGROUND

Integrated circuits (ICs) are typically formed on a semiconductor wafer that is subsequently cut into individual dies. The dies are then typically encased in a package, with various elements on the die connected to corresponding leads on the package. In conventional ICs, each die can include numerous individual devices, including transistors, diodes, capacitors, resistors, and inductors. Moreover, each die can include various connections between such devices, including multiple levels of wiring and various types of vertical interconnects.

A potential problem with such conventional ICs is a formation of cracks on the die. Cracks can form on dies with a variety of structures, including fissures, fractures, and/or other dislocations. The cracking of dies during fabrication, cutting, assembly, packaging, and/or operation can result in various types of IC failures.

The assembly process of semiconductor dies in package or modules involves mechanical forces on the electrical contact pads to connect to a lead frame by solder or bonding process. The mechanical forces create local stress on the pad surfaces and could result mechanical cracks near or below the pad contact surface. Mechanical forces on the carrier tapes used to feed chip scale packaged units with ball or pillar solder pads could create cracks even before the assembly process. Since the cracks can grow after every thermal or mechanical stress of the assembled device sometimes affected devices cannot be revealed during final test and the units may fail in the field.

Die cracks can lead to runaway current leakage that may render the IC inoperable. Furthermore, as modern dies become smaller, thinner, and more densely populated with integrated electrical devices, they can become more susceptible to cracks and resulting IC failures. It is desired to improve the detectability of cracks.

SUMMARY

Some embodiments relate to a semiconductor device comprising an electrical conductive sensor structure connected to a sensor circuit. At least a part of the electrical conductive sensor structure is located below a pad of the semiconductor device. Further, the sensor circuit is configured to detect a value or a change of a value of an electrical parameter associated with the electrical conductive sensor structure indicating a crack within proximity of the pad.

Some embodiments relate to a method of detecting a crack within a semiconductor device. The method comprises detecting a value or a change of a value of an electrical parameter associated with an electrical conductive sensor structure indicating a crack within proximity of the pad. The electrical conductive sensor structure is located below a pad of the semiconductor device.

Some embodiments relate to semiconductor device comprising an electrical conductive sensor structure and a sensor circuit connected to the electrical conductive sensor structure. The sensor circuit comprises a current source circuit connected to a first terminal of the electrical conductive sensor structure. Further, a second terminal of the electrical conductive sensor structure is connectable to a reference potential. Additionally, the sensor circuit comprises a transistor. A gate/base terminal of the transistor is connected to a node between the current source circuit and the first terminal of the electrical conductive sensor structure.

BRIEF DESCRIPTION OF THE FIGURES

Some embodiments of apparatuses and/or methods will be described in the following by way of example only, and with reference to the accompanying figures, in which

FIG. 1b shows a schematic top view of the semiconductor device of FIG. 1a;

FIG. 8 shows a schematic illustration of another semiconductor device.

DETAILED DESCRIPTION

Figure 1A:
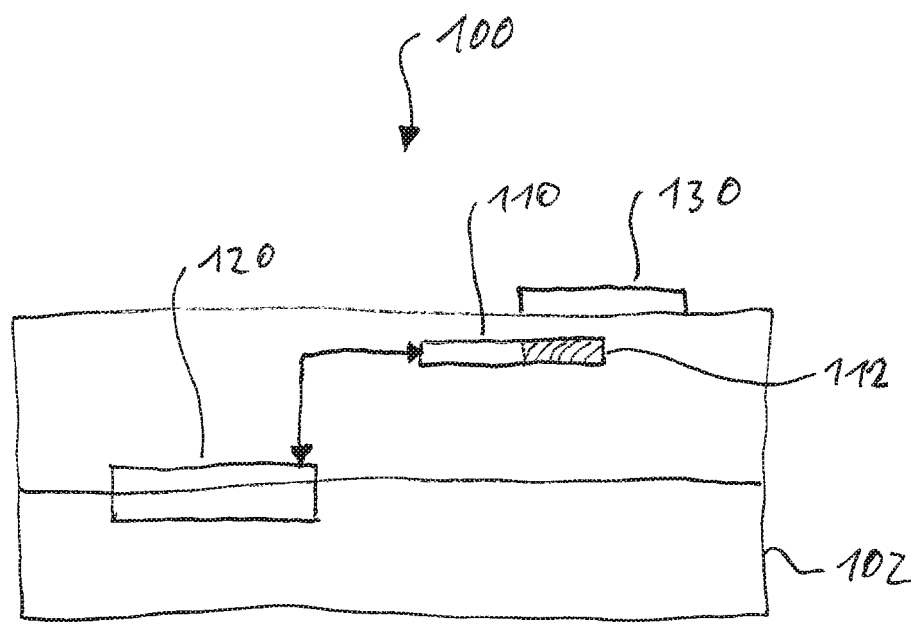
FIG. 1a shows a schematic cross-section of a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

During the manufacturing and use of an integrated chip, mechanical stress due to package molding, drop, soldering, and resoldering can cause a crack to be formed and grow within the integrated chip, thereby damaging underlying metallization and active devices, causing a malfunction in the integrated chip.

Figure 2:
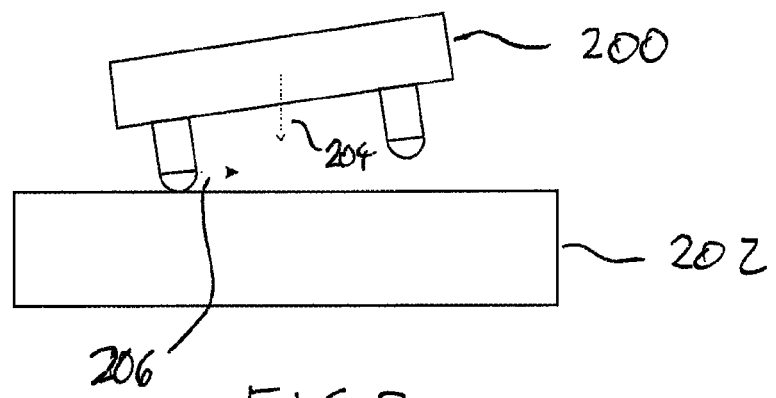
FIG. 2 shows a placement of the semiconductor device onto a substrate.

FIG. 2 shows an example for a placement of a semiconductor device 200 (e.g. chip scale package die) onto a carrier substrate 202 (e.g. printed circuit board PCB, lead frame or flip-chip substrate). In this example, the semiconductor device 200 is flipped upside-down in a flip-chip style arrangement. A placement force 204 is applied during the placement of the semiconductor device 200 onto the substrate 202. Due to the shear forces 206 a crack below the pad structures may appear, but sometimes does not impact the function of the devices especially if no active structures and metal routing are placed under the pad. Even when active structures and routing exist under the pad they are placed possibly far away from the pad surface and are not reached by the damaged oxidation. Crack starting at the pad surface may reach the metal lines and may cause functional failure afterwards.

If the mechanical stress happens after the final production test, the mechanical may cause field failure of the integrated chip. To avoid failures of integrated chips in the field and during production, a method and device for assembly pad crack detection of silicon dies may be proposed.

Figure 1B:
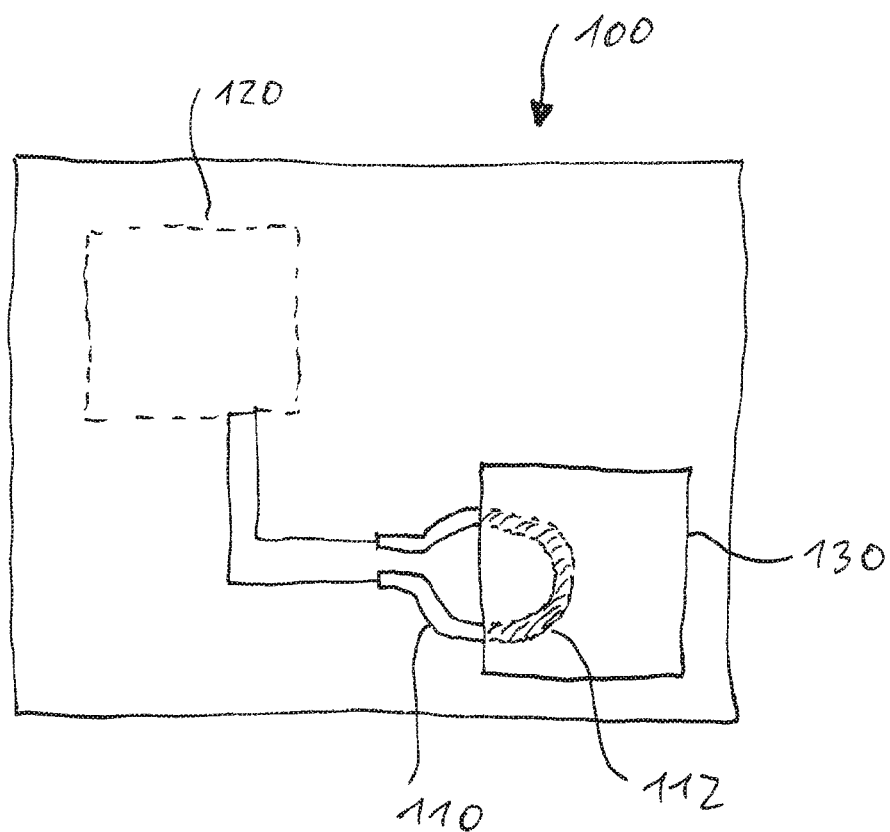

FIGS. 1a and 1b shows a schematic cross-section and top view of a semiconductor device 100 according to an embodiment. The semiconductor device 100 comprises an electrical conductive sensor structure 110 connected to a sensor circuit 120. At least a part 112 of the electrical conductive sensor structure 110 is located below a pad 130 of the semiconductor device 100. Further, the sensor circuit 120 is configured to detect a value or a change of a value of an electrical parameter associated with the electrical conductive sensor structure 110 indicating a crack within proximity of the pad 130.

By implementing a sensor structure below a pad, a crack may be detectable very early. If a crack is formed within proximity of the pad, the crack may be detected before any electrical components within the chip are affected by the crack. As a result of the crack detection, chip failure may be prevented before the crack spreads and affects more parts of the chip. In this way, the reliability and/or the testability of the semiconductor device and/or the detectability of cracks may be improved.

The (first) electrical conductive sensor structure 110 may comprise or consist of electrical conductive material (e.g. metal, as for example, copper, aluminum or an alloy of copper and/or aluminum). The electrical conductive sensor structure 110 may be an electrical conductive line extending below the pad 130. For example, the electrical conductive sensor structure 110 comprises an electrical conductive line extending from a first terminal of the electrical conductive sensor structure 110 to a second terminal of the electrical conductive sensor structure 110. At least a part 112 of the electrical conductive sensor structure 110 or the whole electrical conductive sensor structure 110 is located below the pad 130.

For example, a part 112 of the electrical conductive sensor structure 110 is located below the pad 130, if the part 112 is located vertically between the pad 130 and a semiconductor substrate 102 of the semiconductor device 100 (e.g. FIG. 1a) and the part 112 is located laterally within the lateral area covered by the pad 130 in a top view of the semiconductor device 100 (e.g. FIG. 1b). For example, a structure is located below the pad 130, if the structure has a lateral overlap with the pad 130 and is located vertically closer to the semiconductor substrate than the pad 130.

The pad 130 of the semiconductor device 100 may be a designated contact interface area of the semiconductor device 100 to enable an electrical connection to one or more other (external) electrical devices (e.g. by soldering, wire-bonding or flip chip mounting). The pad 130 may be formed at a top metal layer (e.g. aluminium, copper, gold, silver or an alloy of aluminium, copper, gold and/or silver) of the semiconductor device 100. For example, the electrical conductive sensor structure 110 is implemented in a metal layer comprising a lower thickness than the pad 130.

The sensor circuit 120 may be formed at the semiconductor substrate 102 of the semiconductor device 100 and may comprise electrical elements (e.g. transistors) to enable a detection or determination of a value or a change of a value of an electrical parameter associated with the electrical conductive sensor structure 110. The electrical parameter may be a voltage, a current, a capacity and/or a resistance. For example, the sensor circuit may detect (e.g. monitor, determine or measure) a voltage or a voltage change at the electrical conductive sensor structure 110, a voltage difference between two terminals of the electrical conductive sensor structure 110, a current or a current change through the electrical conductive sensor structure 110, a current or current change between two terminals of the electrical conductive sensor structure 110, a capacity or capacity change of the electrical conductive sensor structure 110 and/or a resistance or resistance change the electrical conductive sensor structure 110. For example, if a crack damages the electrical conductive sensor structure 110, the resistance of the electrical conductive sensor structure 110 may be increased, a voltage drop over the electrical conductive sensor structure 110 may be increased, a voltage at a terminal of the electrical conductive sensor structure 110 may change, a current through the electrical conductive sensor structure 110 may decrease and/or a capacitance of the electrical conductive sensor structure 110 may change.

For example, the sensor circuit 120 may detect a crack or may provide a signal containing information, which indicates that a crack is detected within proximity of the pad 130, based on the detected value or the detected change of a value of the electrical parameter. The signal may be provided to an external device or to an internal control circuit. Alternatively or additionally, the sensor circuit 120 may increase a power consumption of the semiconductor device 100, if the detected value or the detected change of a value of the electrical parameter indicates that a crack within proximity of the pad is detected. In this way, the semiconductor device 100 may be able to communicate that a crack is detected to an external device, which monitors the power consumption of the semiconductor device 100.

For example, the sensor circuit 120 may compare a voltage occurring at a terminal of the electrical conductive sensor structure 110 and a preset voltage threshold (e.g. a voltage indicating that a crack may have damaged the electrical conductive sensor structure). For example, the sensor circuit 120 may output a logical high or logical low (e.g. indicating that a crack is detected) based on the comparison of the voltage occurring at the terminal of the electrical conductive sensor structure and the preset voltage threshold.

For example, the sensor circuit 120 may activate the electrical conductive sensor structure 110 in response to a received test switching signal by connecting a power supply voltage to the electrical conductive sensor structure 110. Further, the sensor circuit 120 may deactivate the electrical conductive sensor structure 110 after detecting the value or a change of the value of an electrical parameter. The test switching signal may be generated by an internal control circuit (e.g. during power-up of the device) or may be received from an external device (e.g. through an analog or digital test interface). By activating the electrical conductive sensor structure 110 during the test and deactivating afterwards, the power consumption of the semiconductor device 100 may be reduced.

For example, the semiconductor device 100 comprises a semiconductor substrate 102. The semiconductor substrate 110 may be a silicon substrate. Alternatively, the semiconductor substrate 110 may be a wide band gap semiconductor substrate having a band gap larger than the band gap of silicon (1.1 eV). For example, the semiconductor substrate 110 may be a silicon carbide (SiC)-based semiconductor substrate, or gallium arsenide (GaAs)-based semiconductor substrate, or a gallium nitride (GaN)-based semiconductor substrate. The semiconductor substrate 110 may be a semiconductor wafer or a semiconductor die.

For example, the vertical direction and a vertical dimension or thicknesses of layers may be measured orthogonal to a front side surface of the semiconductor substrate 102 and a lateral direction and lateral dimensions may be measured in parallel to the front side surface of the semiconductor substrate 102.

The semiconductor device 100 may be any integrated circuit as, for example, a central processing unit (CPU), a microcontroller, a memory, a MEMS (micro-electro-mechanical system) device, a transmitter, a receiver, a transmitter or a power semiconductor device, for example. A power semiconductor device may have a breakdown voltage or blocking voltage of more than 10V (or e.g. more than 100 V, or e.g. more than 500 V), for example.

The (first) electrical conductive sensor structure 110 may be implemented in various ways. For example, the electrical conductive sensor structure 110 may be located vertically closer to the pad 130 than to the semiconductor substrate 102. For example, the electrical conductive sensor structure 110 may be located within an upper most metal layer below the pad 130. In this way, crack originated at the pad 130 may be detected very early and/or before reaching other structures below the electrical conductive sensor structure 110.

Optionally, a second electrical conductive sensor structure may be located below the (first) electrical conductive sensor structure 110 and connected to the sensor circuit 120. For example, the second electrical conductive sensor structure and the (first) electrical conductive sensor structure 110 may comprise different geometries. For example, the (first) electrical conductive sensor structure 110 may comprise a star-shaped geometry (e.g. FIG. 3) and the second electrical conductive sensor structure may comprise a spiral-shaped geometry (e.g. FIG. 4) or vice versa.

Optionally, the semiconductor device 100 may comprise a plurality of electrical conductive sensor structures located below pads of the semiconductor device. For example, an electrical conductive sensor structure may be located below each pad of the semiconductor device 100 respectively. Alternatively, not every pad of the semiconductor device 100 comprises an electrical conductive sensor structure below the pad. For example, the implementation of electrical conductive sensor structures below each pad closest to a corner of the semiconductor device may be sufficient to significantly increase the detectability of cracks, since the mechanical stress at the corner pads may be higher than at other pads during manufacturing and assembly. For example, a rectangular semiconductor substrate has four corners and may have four pads closest to these corners (e.g. if the device has four or more pads). Alternatively, all or some of the pads located closest to an edge of the semiconductor substrate (e.g. line of pads) may comprise an electrical conductive sensor structure below. For example, the plurality of electrical conductive sensor structures may be connected to the sensor circuit in parallel or in series.

Optionally, the semiconductor device 100 may comprise an under bump metallization layer on the pad 130. For example, at least a part of the electrical conductive sensor structure 110 may be located below the under bump metallization layer.

Figure 1C:
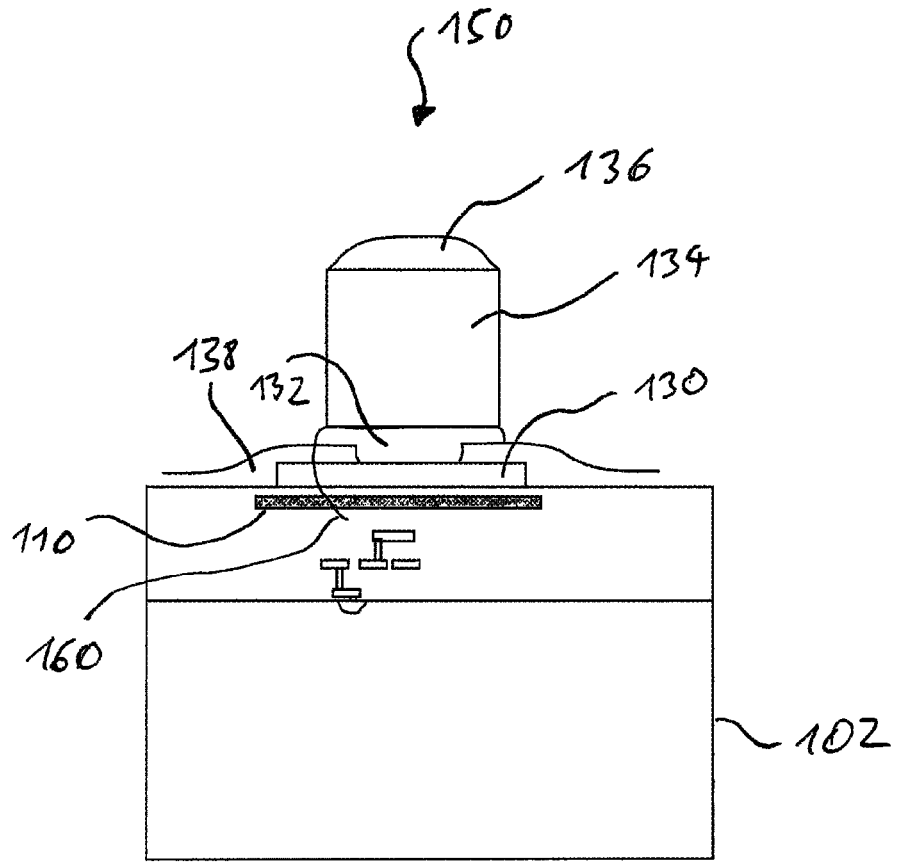
FIG. 1c shows a schematic cross-section of another semiconductor device.

FIG. 1c shows a schematic cross-section of a semiconductor device 150 according to an embodiment. The semiconductor device 150 comprises an electrical conductive sensor structure 110 connected or connectable to a sensor circuit. The sensor circuit may be an internal sensor circuit of the semiconductor device 150 located at the semiconductor substrate 102 of the semiconductor device 150 or the sensor circuit may be an external sensor circuit connected or connectable to the electrical conductive sensor structure 110 of the semiconductor device 150.

The electrical conductive sensor structure 110 of the semiconductor device 150 is located within an upper most metal layer below the pad.

Further, lower metal layers are formed on a semiconductor substrate 102 connected to one or more doing regions (e.g. of one or more transistors or one or more diodes) formed within the semiconductor substrate 102.

The pad 130 may be formed at a top metal layer (e.g. aluminium, copper, gold, silver or an alloy of aluminium, copper, gold and/or silver) in contact with a portion of the upper most metal layer and/or a portion of one or more of the lower metal layers, but insulated from the electrical conductive sensor structure 110. For example, the top metal layer may comprise a thickness of more than 1 μm (e.g. between 2 μm and 5 μm). The upper most metal layer may comprise a thickness of less than 1 μm (or less than 500 nm), for example. A passivation layer 138 (e.g. oxide or nitride) is formed partially over the pad 130. Further, an under bump metallization (UBM) layer 132 (e.g. titanium tungsten TiW, or titanium Ti) is formed on at least a portion of the pad 130 not covered by the passivation layer 138. A portion of the passivation layer 138 is formed between a portion of the under bump metallization layer and the pad. A pillar 134 (e.g. copper pillar) having solder 136 on a top portion is located on top of the UBM layer 132.

Further, FIG. 1c indicates a crack 160 beginning at an edge of the UBM layer 132, and continues to form through the pad 130 and the electrical conductive sensor structure 110. Therefore, the electrical conductive sensor structure 110 may sense the crack 105 before it continues through to the lower metal layers.

FIG. 1c may show an example of a pillar pad structure implementing a structure of pillar type of chipscale package pad. UBM Metallization may be grown over the passivation opening with following thick metal deposition (e.g. galvanic growth) and solder metal on the top. The structures have pillar form and may enable very stable high density assembly in semiconductor packages and modules. However, during placement in carrier tapes and package assembly shear forces especially on edge located pads may appear (e.g. FIG. 2). Since the top metal is used for the contact pad, the crack sensor is created (e.g. of serpentine structure) on the closest located metal layer below the pad, for example.

More details and aspects are mentioned in connection with the embodiments described above or below. The embodiment shown in FIG. 1c may comprise one or more optional additional features corresponding to one or more aspects mentioned in connection with the proposed concept or one or more embodiments described above (e.g. FIGS. 1a and 1b) or below (e.g. FIG. 2-8).

Figure 3:
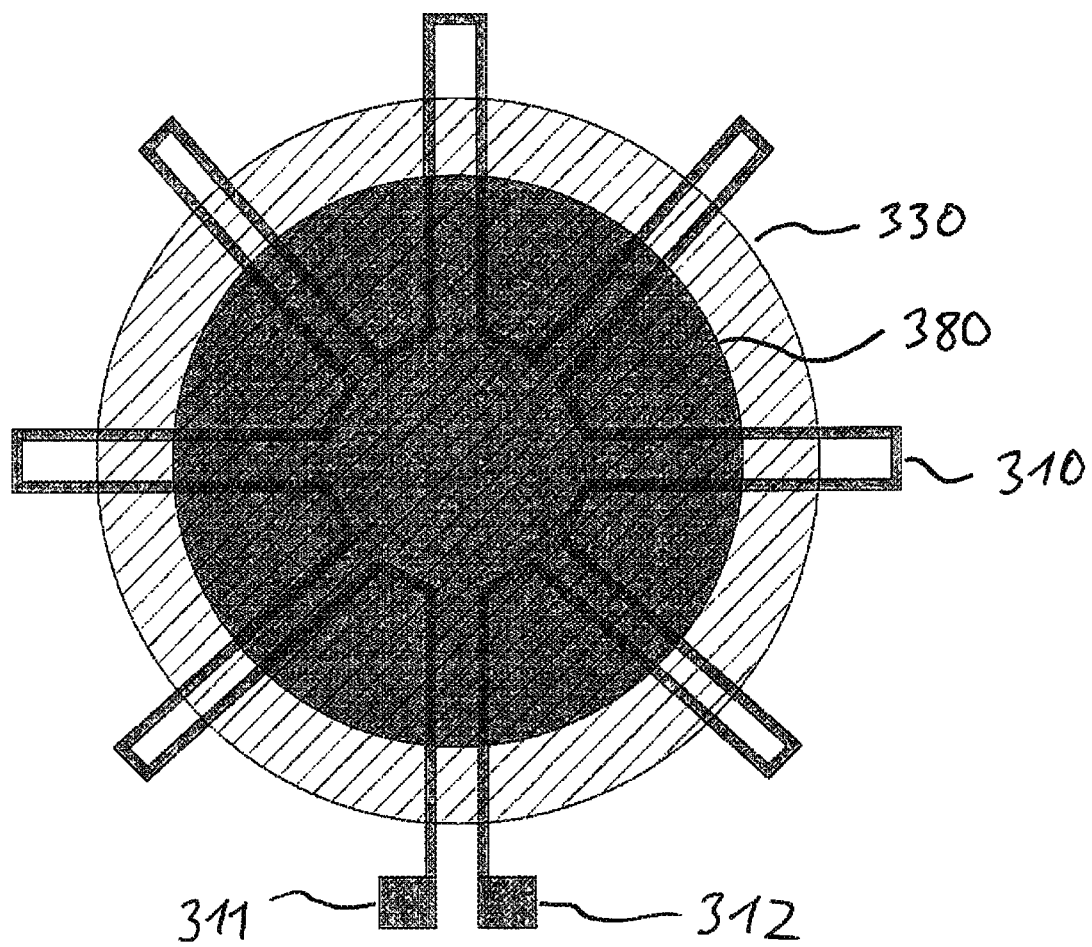
FIG. 3 shows a top-view of an example of an electrical conductive sensor structure of a semiconductor device.

FIG. 3 shows a top-view of an example of a structure of an electrical conductive sensor structure 310 (e.g. pad crack radial sensor structure) of a semiconductor device according to an embodiment. The semiconductor device includes the electrical conductive sensor structure 310, a pad 330, and an under bump metallization (UBM) layer 380 (or pillar). The electrical conductive sensor structure 310 comprises a first terminal 311 and a second terminal 312 (e.g. for connecting the electrical conductive sensor structure to a sensor circuit).

The shape of the electrical conductive sensor structure 310 (e.g. radial crack sensor metal structure) includes thin metal lines radially meandering and connected with two terminals. An outer diameter of the meander of the electrical conductive sensor structure 310 is bigger than a diameter of the pad 330 and the inner diameter is smaller than a diameter of the UBM layer 382, for example.

The electrical conductive sensor structure 310 comprises a star-shaped geometry (e.g. centered below the pad). For example, the electrical conductive sensor structure 310 comprises a plurality of conductive line portions laterally extending outward radially from a substantially center portion. As such, the plurality of conductive line portions of the electrical conductive sensor structure 310 may each laterally extend outward past an outer diameter of the pad 330 and is disposed in a radial formation having an inner diameter smaller than a diameter of at least the pad 330, and/or having an inner diameter smaller than a diameter of the UBM layer 380.

The structure 310 shown in FIG. 3 may be used to sense oxide cracks and may be a thin metal line radial meander with two terminals. The outer diameter of the meander may be slightly bigger than the contact pad 330 and the inner diameter may be smaller than the UBM Pad 380 (e.g. as small as possible). For example, the structure can detect reliably circular type of cracks, which may be a failure mode during assembly. For example, a method of detection may be a resistance measurement between the two terminals. For example, one of the terminals is connected to known potential (e.g. supply voltage or ground) and current is injected into the second terminal. The voltage difference may be measured with a comparator giving result logical high or low depending on a preset voltage (resistance) threshold, for example.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1a-2) or below (e.g. FIG. 4-8).

Figure 4:
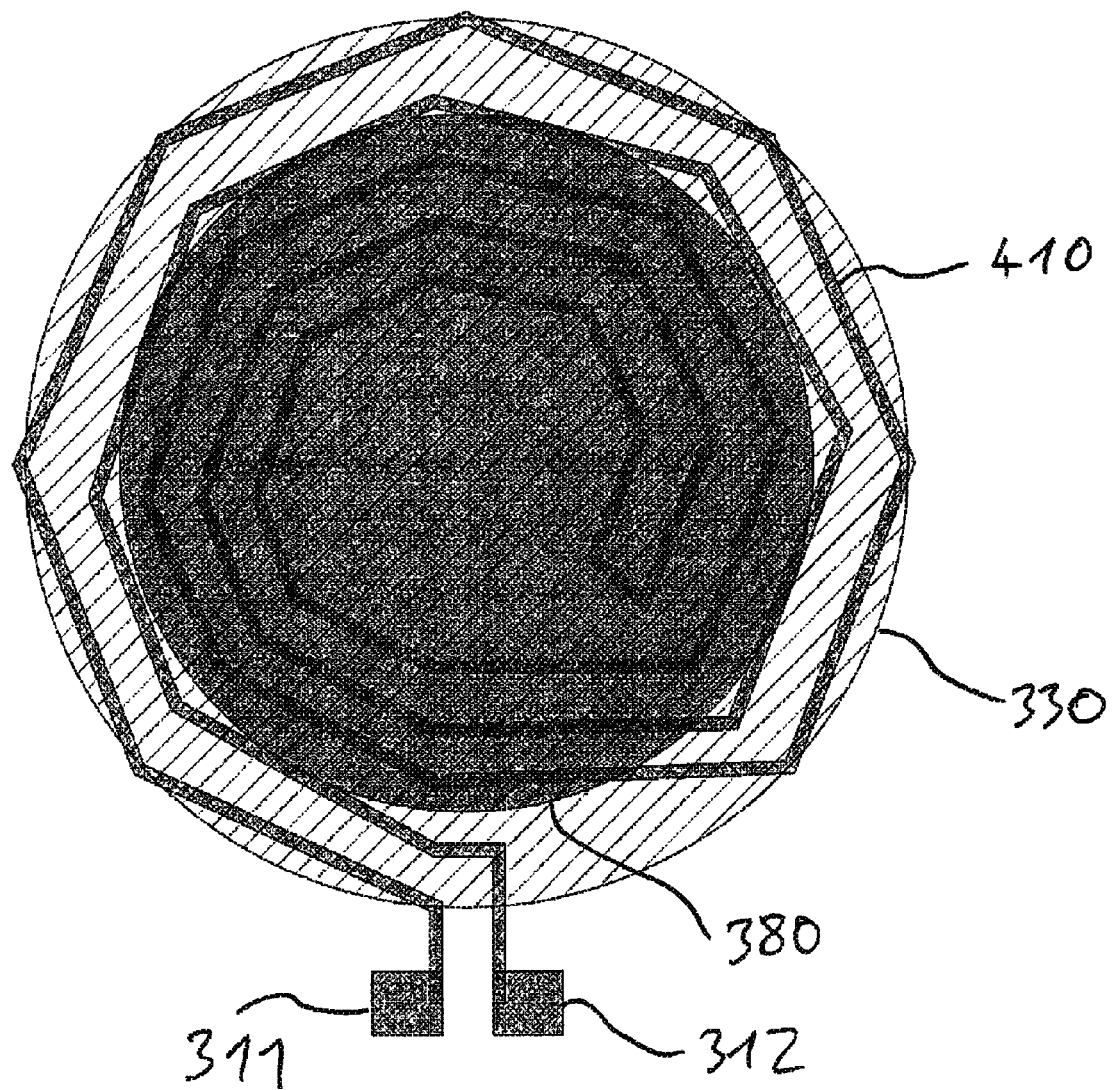
FIG. 4 shows a top-view of another example of an electrical conductive sensor structure of a semiconductor device.

FIG. 4 shows a top-view of another example of a structure of an electrical conductive sensor structure 410 (e.g. pad crack spiral sensor structure) of a semiconductor device according to an embodiment. The implementation of the electrical conductive sensor structure 410 is similar to the implementation shown in FIG. 3, but the geometry of the electrical conductive sensor structure 410 is different. The electrical conductive sensor structure 410 comprises a spiral-shaped geometry.

The shape of the electrical conductive sensor structure 410 may include a double-spiral metal line with outer diameter slightly larger than a diameter of the pad 330 smaller than at least the diameter of the pad 330 and/or a diameter of the UBM 380. For example, the electrical conductive sensor structure 410 comprises a conductive line laterally circumferentially-spiraling toward the substantially center portion.

The structure 410 shown in FIG. 4 may use a double-spiral metal line with outer diameter slightly bigger than the pad and inner diameter as small as possible (e.g. limited by the design rules). This structure 410 may be very sensitive to radial type of cracks and may be used not only for contact pads but also to detect defects from pick-up needles during die placement process, for example.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIG. 1a-3) or below (e.g. FIG. 5-8).

Some embodiments relate to a semiconductor device comprising a first electrical conductive sensor structure 310 as shown and described in connection with FIG. 3 located vertically between a pad of the semiconductor device and a second electrical conductive sensor structure 410 with a geometry as shown and described in connection with FIG. 4 or vice versa.

For example, by stacking the first electrical conductive sensor structure and the second electrical conductive sensor structure 410 on top of one another, a crack missed by the first electrical conductive sensor structure 310 may be detected by the different structure of the second electrical conductive sensor structure 410. For example, the second electrical conductive sensor structure may be located below the first electrical conductive sensor structure or vice versa, such that both electrical conductive sensor structures are connected to a sensor circuit to detect a crack.

Figure 5A:
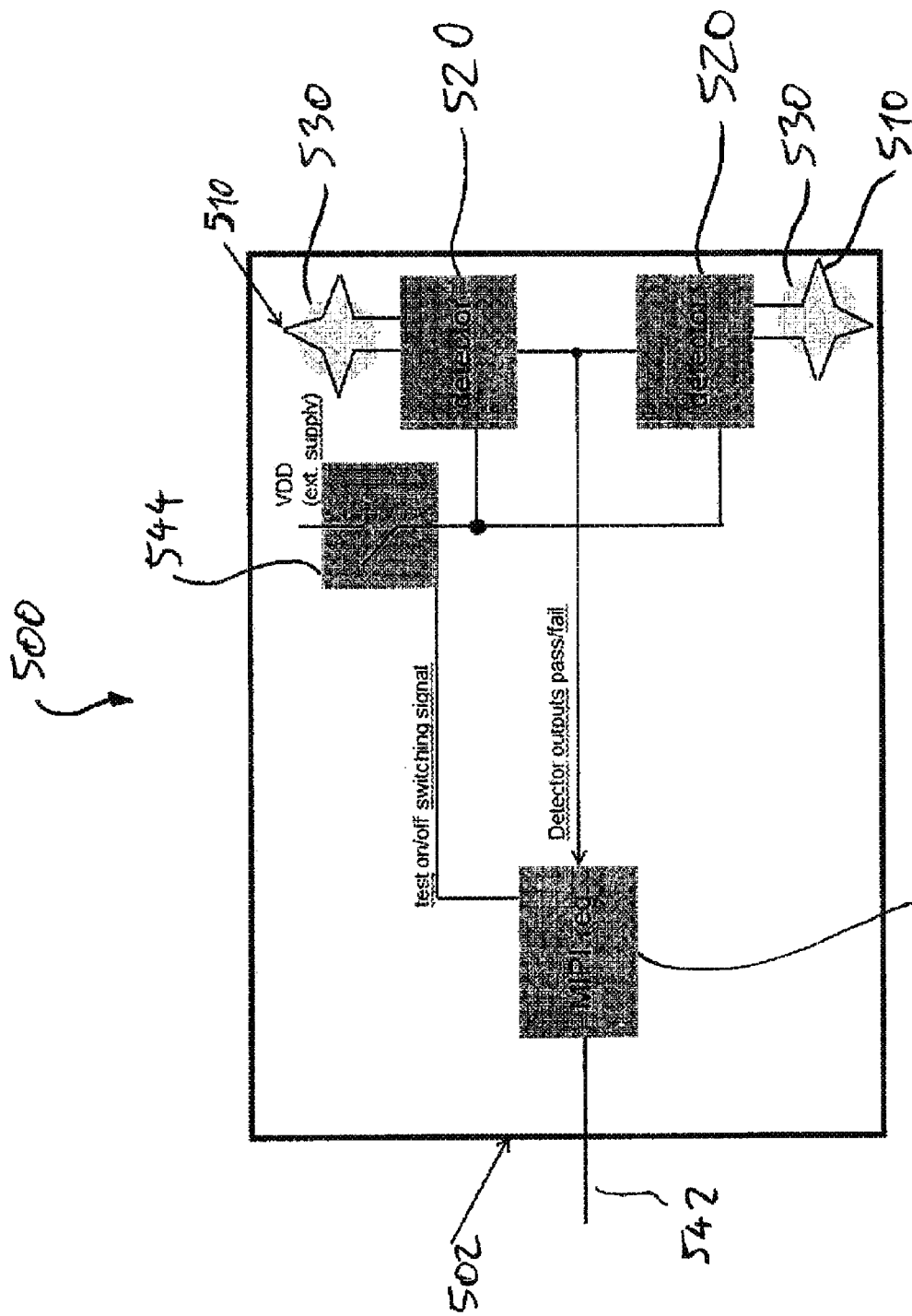
FIG. 5a shows a circuit diagram of a semiconductor device.

FIG. 5a shows a circuit diagram of a semiconductor device 500 according to an embodiment. The semiconductor device 500 comprises a semiconductor die 502 (e.g. chip) comprising a sensor circuit including a plurality of detector circuits 520 connected to a plurality of electrical conductive sensor structures 510 located below a plurality of pads 530 (e.g. corner pads). As such, each one of the plurality of electrical conductive sensor structures 510 corresponds to a respective one of the plurality of pads 530, and thus may each sense cracks that form beneath the plurality of pads 530, for example.

Optionally, the plurality of electrical conductive sensor structures 510 may be installed on the semiconductor die 502 under critical pads 530 in the corners of the semiconductor die 502. The plurality of detector circuits 520 may all have their outputs joined together and led to a test circuit 540 (e.g. one bit-in dedicated diagnose register) of the sensor circuit, for example.

A test mode may be activated by writing to a test circuit 540 (e.g. Mobile Industry Processor Interface MIPI register) by a (digital) device serial bus 542 and readback. As such, during the test mode, the detector circuits 520 may receive a VDD voltage from an external power supply when a switch 544 is turned on in response to a test-on switching signal from the test circuit 540. For example, the sensor circuit may be configured to activate the electrical conductive sensor structures 510 in response to a received test switching signal by connecting a power supply voltage to the electrical conductive sensor structures 510. Further, when the switch 550 is turned off in response to a test-off switching signal from the test register 540, the detector circuits 520 may be disabled and not consuming current.

When a crack is detected, a sensor circuit 520 may output a pass or fail to the test circuit 540 of the sensor circuit.

FIG. 5a may show an example for multiple crack detectors (one for each pad), which are joined together and controlled by register write and read. Multiple sensors may be installed on chip, for example, especially under the critical pads in the corners. The detector circuit outputs may be joined together and led to one bit in dedicated diagnose register. The test mode may be activated by writing to a test register by the device serial bus and readback. The detector circuit may be disabled and not consuming current when not activated.

More details and aspects are mentioned in connection with the embodiments described above or below. The embodiment shown in FIG. 5a may comprise one or more optional additional features corresponding to one or more aspects mentioned in connection with the proposed concept or one or more embodiments described above (e.g. FIG. 1a-4) or below (e.g. FIG. 5b-8).

Figure 5B:
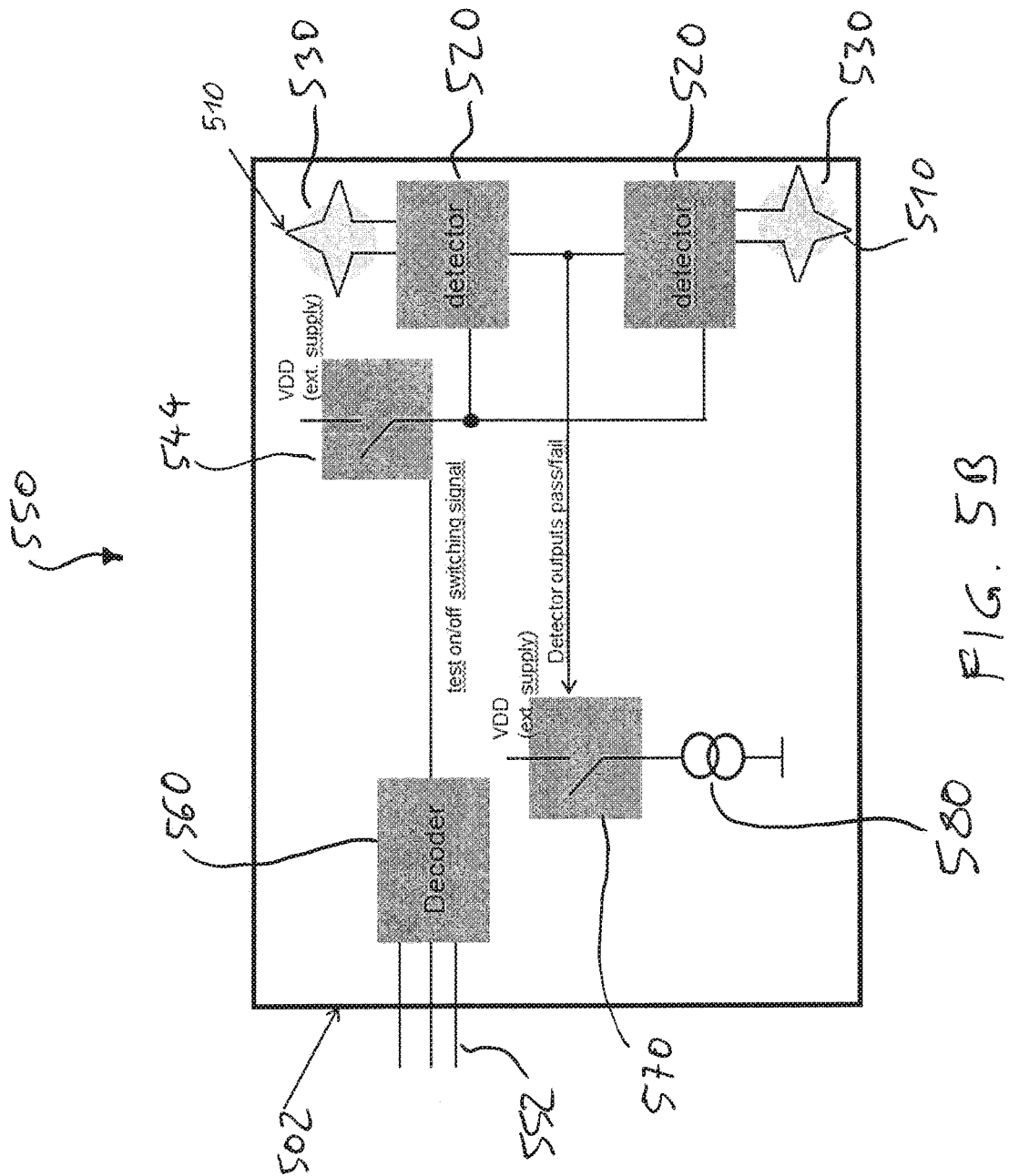
FIG. 5b shows a circuit diagram of another semiconductor device.

FIG. 5b shows a circuit diagram of a semiconductor device 550 according to an embodiment. The implementation of the semiconductor device 550 is similar to the implementation of the semiconductor device shown in FIG. 5a. However, an general purpose input output GPIO interface 552 is used instead of a digital test interface. The GPIO interface 552 is connected to a decoder 560 of the sensor circuit.

The GPIO device (e.g. GPIO interface and decoder) may use specific control voltage combination to activate the crack detectors and draw certain predefined current in case of detected crack (e.g. by switching 570 a current source/resistor 580 between VDD and GND). The result of the test may be evaluated by sensing the supply current, for example.

More details and aspects are mentioned in connection with the embodiments described above or below. The embodiment shown in FIG. 5b may comprise one or more optional additional features corresponding to one or more aspects mentioned in connection with the proposed concept or one or more embodiments described above (e.g. FIG. 1a-5a) or below (e.g. FIG. 6-8).

Figure 6:
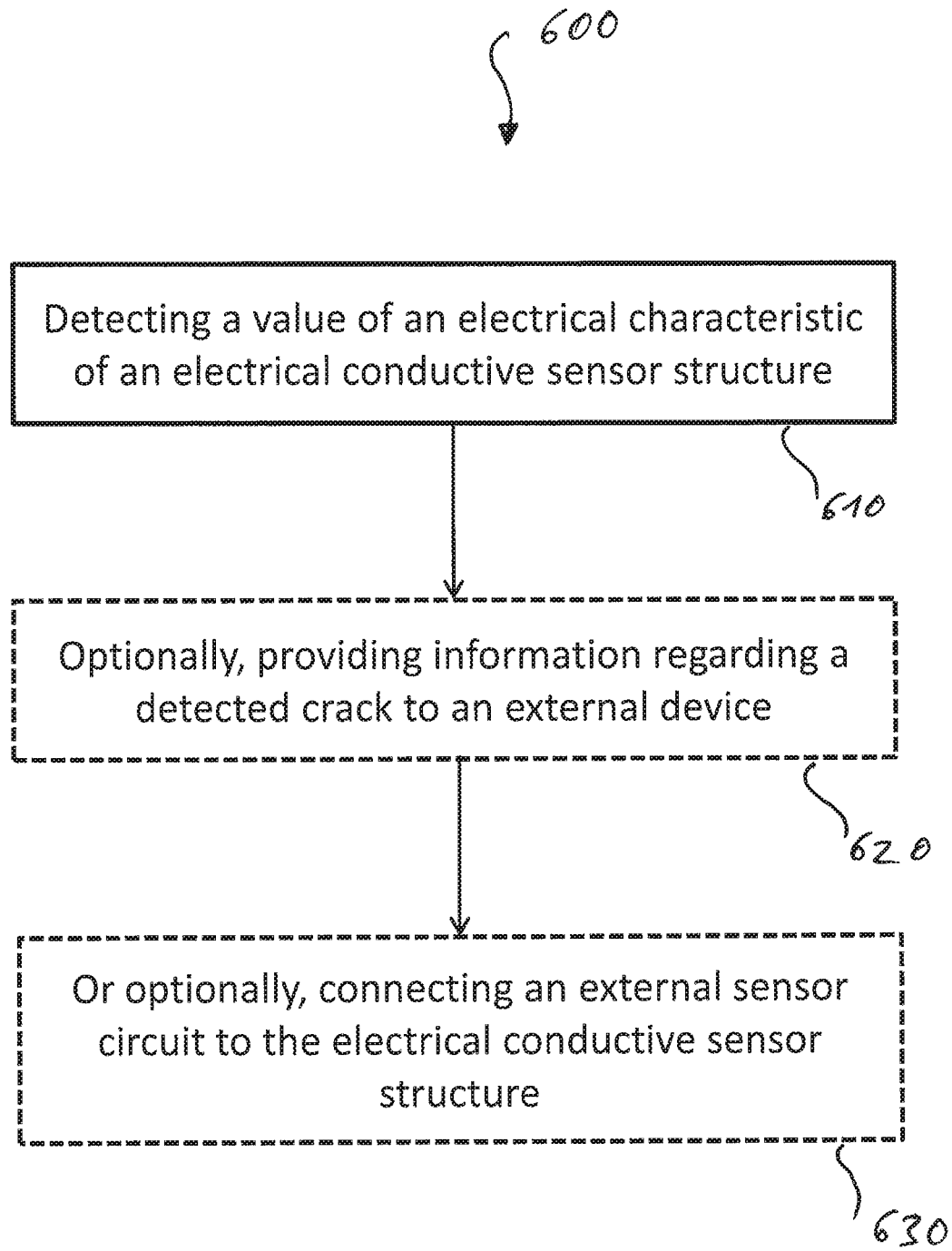
FIG. 6 shows a flow chart of a method for detecting a crack within a semiconductor device.

FIG. 6 shows a flow chart of a method 600 of detecting a crack within a semiconductor device according to an embodiment. The method 600 comprises detecting 610 a value or a change of a value of an electrical parameter associated with an electrical conductive sensor structure indicating a crack within proximity of the pad. The electrical conductive sensor structure is located below a pad of the semiconductor device.

By implementing a sensor structure below a pad, a crack may be detectable very early. In this way, the reliability and/or the testability of the semiconductor device and/or the detectability of cracks may be improved.

Optionally, the method 600 may further include providing 620 information related to a detected value or a detected change of a value of the electrical parameter to an external device. Information related to the detected value or the detected change of the value of the electrical parameter may be the detected value or the detected change of the value itself or information determined based on the detected value or the detected change of the value. Information determined based on the detected value or the detected change of the value may be information (e.g. logical high or low level of a digital test output signal or a predefined level of an analog signal or a predefined increase of the power consumption) indicating that a crack or a malfunction is detected, for example. The information related to a detected value or a detected change of a value of the electrical parameter may be determined and/or provided by an internal sensor circuit connected to the electrical conductive sensor structure.

Alternatively, the method 600 may optionally include connecting an external sensor circuit to the electrical conductive sensor structure of the semiconductor device. In this example the value or the change of the value of the electrical parameter may be detected by the external sensor circuit.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIG. 1a-5b) or below (e.g. FIG. 7-8).

Figure 7:
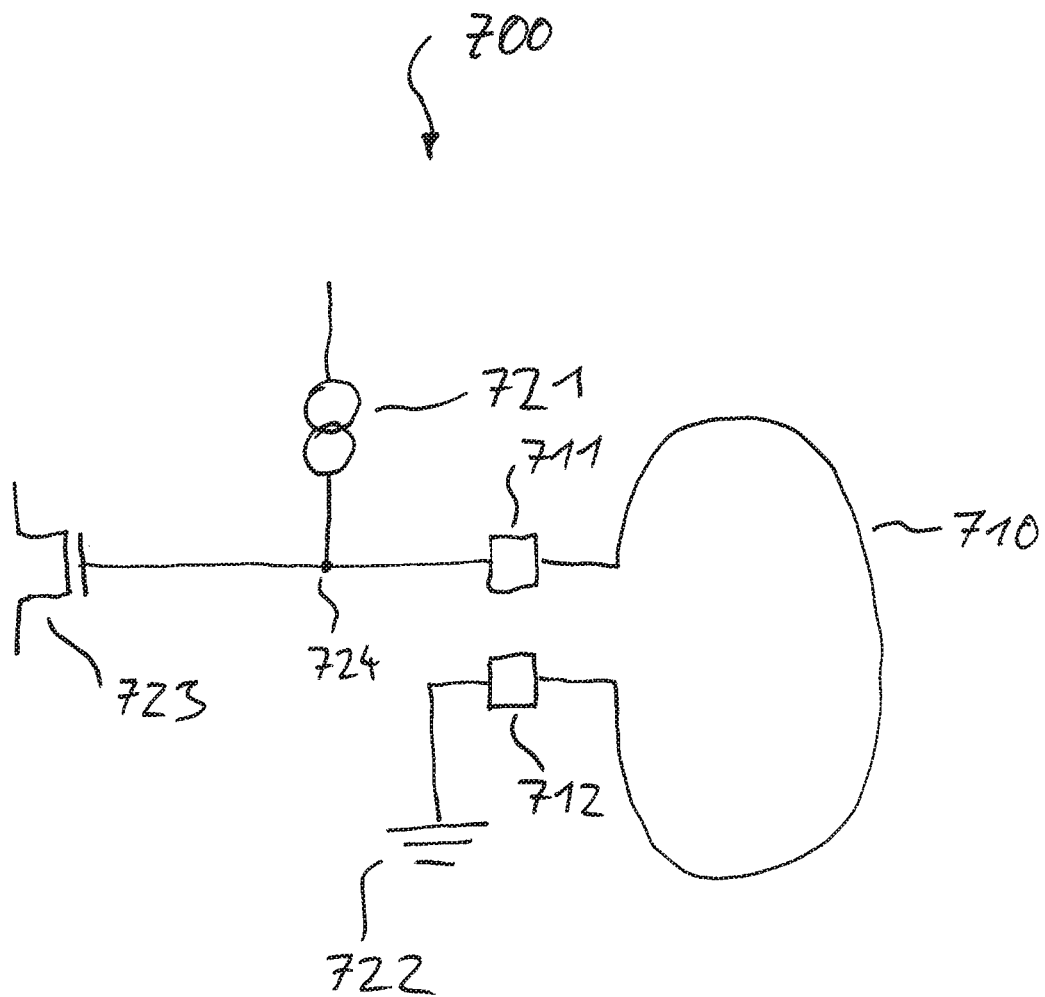
FIG. 7 shows a schematic illustration of a semiconductor device.

FIG. 7 shows a schematic illustration of a semiconductor device 700 according to an embodiment. The semiconductor device 700 comprises an electrical conductive sensor structure 710 and a sensor circuit connected to the electrical conductive sensor structure 710. The sensor circuit comprises a current source circuit 721 connected to a first terminal 711 of the electrical conductive sensor structure 710. Further, a second terminal 712 of the electrical conductive sensor structure 710 is connectable to a reference potential 722 (e.g. ground). Additionally, the sensor circuit comprises a transistor 723. A gate/base terminal of the transistor is connected to a node 724 between the current source circuit 721 and the first terminal 711 of the electrical conductive sensor structure 710.

By connecting a gate/base terminal of a transistor to a node between a current source and a sensor structure, a change of a voltage at the node due to a crack damaging the sensor structure may be detectable with high reliability and/or low effort.

The transistor may be a field effect transistor or a bipolar transistor. For example, a logical high or low signal or an analog signal with a predefined level may be generated at a source/emitter terminal or a drain/collector terminal of the transistor indicating a damage of the electrical conductive sensor structure 710 or a power consumption of the semiconductor device 700 may be increased, if a voltage at the gate/base terminal of the transistor changes to a voltage larger than a threshold voltage of the transistor.

The current source circuit 721 may be configured to limit a current through the electrical conductive sensor structure 710, if the second terminal 712 of the electrical conductive sensor structure 710 is connected to the reference potential 722.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1a-6) or below (e.g. FIG. 8).

FIG. 8 shows a schematic illustration of another semiconductor device 800 according to an embodiment. The implementation of the semiconductor device 800 is similar to the implementation of the semiconductor device shown in FIG. 7. The electrical conductive sensor structure is implemented as described in connection with FIG. 3 and the current source circuit 721 is connectable to an external supply voltage VDD through a switch 810 (e.g. transistor). The transistor 723 may be used as detector output.

FIG. 8 may show a detector schematic allowing parallel connection of multiple sensors (sensor structures).

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1a-7) or below.

Some embodiments relate to a semiconductor die pad crack detection. The proposed method and device may discover mechanical cracks due to bond-, bump- and pillar pad damage before, after the assembly process and in the field, for example. The proposed concept may allow to discover mechanical cracks even before functional failure of the chip and/or may allow to increase the layout density below the pads and/or decrease the die size.

According to an aspect, the implementation of a capacitive type of sensor with second plate below the top metal pad may be enabled. Alternatively, a resistive type of sensor may be implemented with low complexity.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The invention claimed is:

1. A semiconductor device comprising:
   an electrical conductive sensor structure comprising an inner diameter and an outer diameter, wherein at least a part of the electrical conductive sensor structure is located below a pad of the semiconductor device, wherein the pad of the semiconductor device is insulated from the electrical conductive sensor structure, wherein the outer diameter of the electrical conductive sensor structure is bigger than a diameter of the pad and the inner diameter of the electrical conductive sensor structure is smaller than the diameter of the pad; and a sensor circuit connected to the electrical conductive sensor structure, wherein the sensor circuit is configured to detect a value or a change of a value of an electrical parameter associated with the electrical conductive sensor structure indicating a crack within proximity of the pad.

2. The semiconductor device of claim 1, wherein the electrical parameter is at least one of voltage, current, capacity, and resistance.

3. The semiconductor device of claim 1, wherein the sensor circuit is configured to measure a voltage difference between two terminals of the electrical conductive sensor structure.

4. The semiconductor device of claim 1, wherein the sensor circuit is configured to compare a voltage occurring at a terminal of the electrical conductive sensor structure and a preset voltage threshold.

5. The semiconductor device of claim 4, wherein the sensor circuit is configured to output a logical high or logical low based on the comparison of the voltage occurring at the terminal of the electrical conductive sensor structure and the preset voltage threshold.

6. The semiconductor device of claim 1, wherein the sensor circuit is configured to increase a power consumption of the semiconductor device, if the detected value or the detected change of a value of the electrical parameter indicates that a crack within proximity of the pad is detected.

7. The semiconductor device of claim 1, wherein the sensor circuit is configured to activate the electrical conductive sensor structure in response to a received test switching signal by connecting a power supply voltage to the electrical conductive sensor structure.

8. The semiconductor device of claim 1, wherein the electrical conductive sensor structure is located within an upper most metal layer below the pad.

9. The semiconductor device of claim 1, wherein the electrical conductive sensor structure is a first electrical conductive sensor structure, the semiconductor device further comprising a plurality of electrical conductive sensor structures including the first electrical conductive sensor structure and a second electrical conductive sensor structure located below the pad, wherein the first electrical conductive sensor structure is located between the pad and the second electrical conductive sensor structure.

10. The semiconductor device of claim 9, wherein electrical conductive sensor structures of the plurality of electrical conductive sensor structures are located at least below each pad closest to a corner of the semiconductor device.

11. The semiconductor device of claim 9, wherein the plurality of electrical conductive sensor structures are electrically connected in parallel or in series to the sensor circuit.

12. The semiconductor device of claim 1, wherein the electrical conductive sensor structure comprises a plurality of conductive line portions laterally extending outward radially from a substantially center portion, wherein the substantially center portion defines the inner diameter of the electrical conductive sensor structure.

13. The semiconductor device of claim 1, wherein the electrical conductive sensor structure comprises a conductive line laterally circumferentially-spiraling toward a substantially center portion, wherein the substantially center portion defines the inner diameter of the electrical conductive sensor structure.

14. The semiconductor device of claim 1, further comprising a second electrical conductive sensor structure located below the electrical conductive sensor structure and connected to the sensor circuit.

15. A semiconductor device comprising:
an electrical conductive sensor structure comprising an inner diameter and an outer diameter, wherein at least a part of the electrical conductive sensor structure is located below a pad of the semiconductor device, wherein the outer diameter of the electrical conductive sensor structure is bigger than a diameter of the pad;
a sensor circuit connected to the electrical conductive sensor structure, wherein the sensor circuit is configured to detect a value or a change of a value of an electrical parameter associated with the electrical conductive sensor structure indicating a crack within proximity of the pad; and
an under bump metallization layer on the pad, wherein at least a part of the electrical conductive sensor structure is located below the under bump metallization layer, and wherein the inner diameter of the electrical conductive sensor structure is smaller than a diameter of the under bump metallization layer.

16. A method of detecting a crack within a semiconductor device, the method comprising:
detecting a value or a change of a value of an electrical parameter associated with an electrical conductive sensor structure indicating the crack within proximity of a pad, wherein the electrical conductive sensor structure is located below the pad of the semiconductor device, wherein the pad of the semiconductor device is insulated from the electrical conductive sensor structure, wherein electrical conductive sensor structure comprises:
an outer diameter bigger than a diameter of the pad; and
an inner diameter smaller than the diameter of the pad.

17. The method of claim 16, further comprising providing information related to a detected value or a detected change of a value of the electrical parameter to an external device.

18. The method of claim 16, further comprising connecting an external sensor circuit to the electrical conductive sensor structure of the semiconductor device, wherein the value or the change of the value of the electrical parameter is detected by the external sensor circuit.

19. A semiconductor device, comprising:
an electrical conductive sensor structure located below a pad of the semiconductor device, wherein the electrical conductive sensor structure comprises an inner diameter and an outer diameter, wherein the pad of the semiconductor device is insulated from the electrical conductive sensor structure, wherein the outer diameter of the electrical conductive sensor structure is bigger than a diameter of the pad and the inner diameter of the electrical conductive sensor structure is smaller than the diameter of the pad; and
a sensor circuit connected to the electrical conductive sensor structure, wherein the sensor circuit comprises a current source circuit connected to a first terminal of the electrical conductive sensor structure, wherein a second terminal of the electrical conductive sensor structure is connectable to a reference potential, wherein the sensor circuit comprises a transistor, wherein a gate/base terminal of the transistor is connected to a node between the current source circuit and the first terminal of the electrical conductive sensor structure.

20. The semiconductor device of claim 19, wherein the sensor circuit is configured to measure a voltage difference between the first terminal of the electrical conductive sensor structure and the second terminal of the electrical conductive sensor structure.

* * * * *